United States Patent [19]
Arch et al.

[11] Patent Number: 4,614,957
[45] Date of Patent: Sep. 30, 1986

[54] ELECTROMAGNETIC RADIATION DETECTORS

[75] Inventors: David K. Arch, Edina; M. Walter Scott, Minnetonka; Darryl L. Smith, Edina; Leonard R. Weisberg, Minneapolis, all of Minn.

[73] Assignee: Honeywell Inc., Minneapolis, Minn.

[21] Appl. No.: 677,336

[22] Filed: Dec. 4, 1984

Related U.S. Application Data

[63] Continuation of Ser. No. 363,980, Mar. 31, 1982, abandoned.

[51] Int. Cl.⁴ .......................................... H01L 29/161
[52] U.S. Cl. ..................................... 357/16; 357/30; 357/56; 357/61
[58] Field of Search .................... 357/30, 16, 61, 56

[56] References Cited

U.S. PATENT DOCUMENTS

| | | | |
|---|---|---|---|
| 4,376,659 | 3/1983 | Castro | 357/16 X |
| 4,494,132 | 1/1985 | Kohn | 357/30 |
| 4,549,195 | 10/1985 | Bluzer | 357/30 |

Primary Examiner—Martin H. Edlow
Attorney, Agent, or Firm—Charles G. Mersereau

[57] ABSTRACT

An improved electromagnetic radiation-sensitive semiconductor device together with a method of making same is disclosed in which surface regions directly beneath the active portion of the electrical contacts are provided with a layer of semiconductor material having a higher bandgap than the radiation sensitive material which repels minority carriers but allows the passage of majority carriers. Because the rate of annihilation of minority carriers at the contact to which they are attracted is reduced, the responsivity of the detector is greatly enhanced.

22 Claims, 12 Drawing Figures

ELECTROMAGNETIC RADIATION DETECTORS

This application is a continuation of application Ser. No. 363,980, filed Mar. 31, 1982, now abandoned.

BACKGROUND OF THE INVENTION

1. Field of the Invention

The present invention relates generally to semiconductor electromagnetic radiation detectors. In particular, the present invention relates to an improved detector incorporating a higher bandgap layer under the point of electrical contact to retard minority carriers and enhance the sensitivity of the detector.

2. Description of the Prior Art

Photosensitive semiconductors are basically of two types, photoconductive and photovoltaic. When radiation of the proper energy falls upon a photoconductive semiconductor, the conductivity of the semiconductor increases. Energy supplied to the semiconductor causes covalent bonds to be broken, and electron-hole pairs in excess of those generated thermally are created. These increased current carriers decrease the resistance of the material. This "photoconductive effect" in semiconductor materials is used in photoconductive detectors.

If, on the other hand, the semiconductor sensor is such that it incorporates a pn junction, it gives rise to electron-hole pairs which create a potential difference in response to radiation of the proper energy. This is referred to as a "photovoltaic" effect. The semiconductor electromagnetic radiation detectors of the present invention are photoconductive detectors.

A photoconductive detector can be a bar of semiconductor material having electrical contacts at the ends. In its simplest use, the photoconductive detector is connected in series with a direct-current voltage source and a load resistor. The change in resistivity of the photoconductive detector in response to incident radiation is sensed.

The present invention deals primarily with increasing the photosensitivity or responsivity of the detector to the electromagnetic wavelengths corresponding to the application of the device. It has been discovered that the best method to accomplish this is to reduce the rate of annihilation of the minority carriers to thereby increase or maximize the lifetime of the minority carriers generated by absorbed incident photons so that the excess majority carriers continue to flow for an increased length of time.

In general, most of the minority carriers are annihilated in one of three basic areas. These are within the detector bulk, at the surfaces of the detector including the surface exposed to the incident radiation, and at the electrical contacts to the detector.

The prior art teaches methods to reduce the rate of annihilation of the minority carriers within the detector bulk. One well known method for detectors of visible radiation is to incorporate impurities or lattice defects into the detector material which act to temporarily trap the minority carriers and thus reduce the rate of annihilation. Such a technique is described in R. B. Bube, "Photoconductivity of Solids", New York (1960), at p. 69.

The prior art also teaches methods to prevent the minority carriers from recombining at the surface areas such as at the back of the detector or at the area exposed to the incident radiation by chemically or physically treating the surfaces or depositing a thin layer of a chemical compound on the surface. This is known as "passivation". Typically, the treatment creates electronic states on the surface which create an energy barrier that repels the minority carriers.

Unfortunately the prior art methods of passivating the surface create a layer at the surface that prevents or interferes with the formation of a good electrical contact. The existence of a good electrical contact means that majority carriers can be efficiently injected from the contact into the detector with no barrier or excessive resistance to their flow. Accordingly, either the surface has not been treated in the area in which the electrical contacts are placed, or the surface layer that is formed has been removed from the contact area prior to the formation of the electrical contacts. Thus, treatment has not been made directly under the electrical contacts.

An alternate approach to the protection of the surface exposed to the incident radiation in photovoltaic devices is to incorporate a layer of higher bandgap material at the sensitive area exposed to the incident radiation. Such a technique is described in the U.S. Pat. No. 4,132,999 issued Jan. 2, 1979. By that technique, however, the electrical contacts are caused to penetrate through the higher bandgap layer to the infrared sensitive material so that again there is no protection under the contacts. Yet another prior art approach involves the incorporation of a layer of higher doped material at the surfaces. That approach is described in U.S. Pat. No. 4,137,544 issued Jan. 30, 1979. As with the last described technique, however, the higher doped layer does not extend under the active portion of the electrical contacts.

A different prior art approach is described by M. A. Kinch et al (Infrared Physics, Volume 17, pp. 137–145, 1977) in which the incident radiation is absorbed in a region that is not contiguous with the electrical contacts, i.e., geometrical separated from the electrical contacts. In this manner, the minority carriers that are generated by the incident radiation take a longer time to reach the contacts, thereby increasing the average life of the minority carriers.

In the case of infrared photoconductive detectors, operation is frequently in what is called the "sweepout" mode wherein the electrical contacts are placed quite close together on the semiconductor material. In this mode, the electric field applied to the detector moves the minority carriers to the electrical contacts in a very short length of time. The time that the minority carriers take to reach the electrical contact is then so short that the possibility of the minority carriers being annihilated within the detector material is greatly reduced. Additionally, the effect of annihilation of minority carriers at the surfaces of the detector is also reduced. This rapid rate of annihilation of minority carriers by recombination at the electrical contact area can limit the responsivity of infrared detectors in general, and typically will limit the responsivity severely when the photoconductive detector is operated in the sweepout mode.

The full significance of this phenomenon has not generally been appreciated in the prior art. According to the present invention, it has been discovered that reducing the annihilation of minority carriers directly under the contact can increase the responsivity of the detector far more than was previously recognized.

A prior art attempt at a related solution is described by Y. J. Shacham-Diamand and I. Kidron (Infrared Physics, Vol. 21, p. 105, 1981) as a method to improve the responsivity by reducing the rate of recombination of minority carriers in the immediate vicinity of the electrical contacts to the semiconductor. This was accomplished by incorporating a built-in electric field opposing the collection of minority carriers under the cathode contacts. The built-in electric field resulted from the diffusion of donors into the $Hg_{1-x}Cd_xTe$ semiconductor which, in turn, resulted in a gradient in the electron concentration over about a two-micron region beneath the contact. Thus, the region under the contact was made n+ if the detector material was n-type. Although some increase in responsivity of the detectors has been achieved by this approach, it has some inherent drawbacks. A disadvantage of this approach is that the added n+ dopant leads to a decreasing minority carrier lifetime in the contact region which makes the system self-limiting in responsivity. In addition, the built-in electric field is limited by the solubility limit of the n+ dopant which reduces the blocking effect on the minority carriers.

Thus, the prior art has provided means for improving the responsivity of infrared detectors by reducing the rate of annihilation of minority carriers within the bulk of the infrared detector materials, and by preventing annihilation of minority carriers at surfaces of the detector that are not used for making electrical contacts to the detector. The prior art has further disclosed means to prolonging the lifetime of the minority carrier by using a geometry in which the electrical contacts are placed at an increased distance from the absorbed incident radiation. However, the prior art has not disclosed a truly effective means of improving infrared detector response by reducing the rate of annihilation of minority carriers upon reaching the electrical contact.

SUMMARY OF THE INVENTION

The present invention effectively solves the problems associated with reduction of the rate of annihilation of minority carriers at the electrical contact of semiconductor electromagnetic radiation detectors. This is accomplished by the provision of an improved detector and method of making in which the rate of annihilation of minority carriers at the electrical contact of the detector is greatly reduced without significantly affecting the average carrier concentration in the photosensitive semiconductor material. This is accomplished by providing surface passivation of the semiconductor material directly beneath the electrical contact. According to the present invention, the surface of the infrared detector material is treated in a manner which impedes minority carriers from the surface and yet creates no significant barrier to the passage of majority carriers.

The detector surface treatment consists of forming an additional thin layer on the surface of the detector beneath the contact attracting minority carriers, or both contacts, if desired. This is a material which has a higher energy bandgap than the detector material and which is of the same conductivity type, i.e., n-type if the majority carriers are electrons, and p-type if the majority carriers are holes. Subsequently a compatible metallic layer is deposited onto the surface in the designated contact areas to form ohmic contact with the higher bandgap layer.

In a preferred embodiment, a $Hg_{1-x}Cd_xTe$ photoconductive infrared detector which typically has a composition of about $Hg_{0.8}Cd_{0.2}Te$ formed as a photosensitive layer on a substrate is treated by adding regions of $Hg_{1-y}Cd_yTe$ wherein y is greater than x, in the areas where the electrical contacts are to be connected. Increasing the ratio of Cd to Hg increases the energy gap between the valence level and the conductance level of the material. Both the photoconductive layer and the higher bandgap layer are preferably fabricated by epitaxial formation, particularly liquid phase epitaxy, and are made n-type. Thus, a detector having an x of 0.20, it has been found that a higher bandgap alloy having a y in the rage of 0.21 to 0.30 will work quite successfully.

The higher bandgap of the surface layer directly under the contact creates an energy barrier which serves to impede the minority carriers. However, no significant barrier exists for the flow of the majority carriers from the contact into the detector material. Depending on which contact attracts the minority carriers, if desired, the area beneath only the cathode or anode need be provided with the higher bandgap layer. Thus, by means of the present invention the rate of recombination of minority carriers at the contacts is reduced, which increases the lifetime of the minority carriers, and in turn increases the responsivity.

While the invention is particularly described with reference to $Hg_{1-x}Cd_xTe$ semiconductor material, it is contemplated that such other photosensitive materials as $InAs_xSb_{1-x}$, $In_xGa_{1-x}Sb$ and $Pb_{1-x}Sn_xTe$ may be substituted. Also other fabrication processes known to those skilled in the art may be used.

BRIEF DESCRIPTION OF THE DRAWINGS

In the drawings, wherein like numerals are utilized to depict like parts throughout the same.

DESCRIPTION OF THE PREFERRED EMBODIMENT

Infrared detectors include a class of materials with energy bandgaps in the range of infrared radiation, typically below 0.8 electron volts. This class includes, for example, materials such as $InAs\ Sb_{1-x}$, $In_x$-$Ga_{1-x}Sb$, $Pb_{1-x}Sn_xTe$ and $Hg_{1-x}Cd_xTe$, where the quantity x is a number between 0 and 1 as appropriate to the properties desired. This class of detectors is referred to as "intrinsic" detectors. A second class of infrared detectors have larger energy bandgaps, but are doped with or have impurities added to provide sensitivity to infrared radiation. This class of materials includes, for example, germanium or silicon doped with gold, and is called "extrinsic" detectors. The present invention, by way of example, will be described with specific reference to the well-known detector material $Hg_{1-x}Cd_xTe$.

Figure 1:
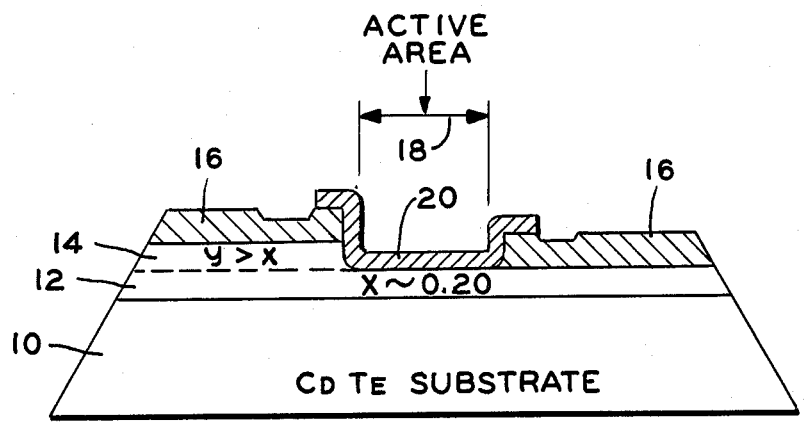
FIG. 1 is a sectional view of a detector fabricated in accordance with the present invention.

In the embodiment illustrated in FIG. 1 a substrate 10 which may be CdTe supports a thin layer of the detector material 12, which may be $Hg_{1-x}Cd_xTe$. The value of x is greater than 0 but less than unity and in a typical detector is norminally between 0.1 and 0.4. The thickness of the layer 12 is generally from about $5 \times 10^{-4}$ cm to about $15 \times 10^{-4}$ cm. An area of the layer 12 is covered with a thin layer 14 which has a larger bandgap than the detector material. The larger bandgap thin layer 14 has a corresponding composition of $Hg_{1-y}Cd_yTe$ wherein y is greater than x of the layer 12 and has a thickness of from about $10^{-4}$ cm to about $10^{-3}$ cm. As discussed in greater detail below, both the layer 12 and the layer 14 may be formed by a growth process in which a thin layer is grown by liquid phase epitaxy onto the detector substrate material 10. Subsequently, a metal layer 16, compatible with and known to form an ohmic contact to either layer 12 or 14, is deposited as a thin layer onto the surface of layers 12 and 14 in the desired geometry to form the electrical contacts. The photoactive area beneath the arrow at 18 may be provided with a thin surface passivation layer 20. Finally metal wires, not shown, are bonded to metal layers 16.

One successful embodiment of a photoconductor in accordance with FIG. 1 the invention was produced using the material HgCdTe according to a process which will now be described. The process is illustrated by FIGS. 2A-2J.

Figure 2A:
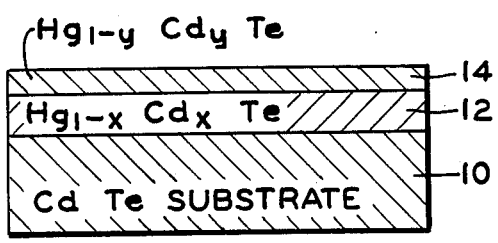
FIGS. 2A through 2J depict stages in one process for producing a detector in accordance with one embodiment of the invention.
Figure 2B:
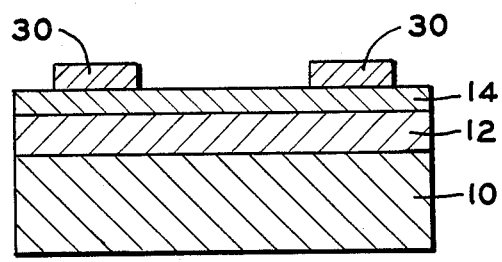
Figure 2C:
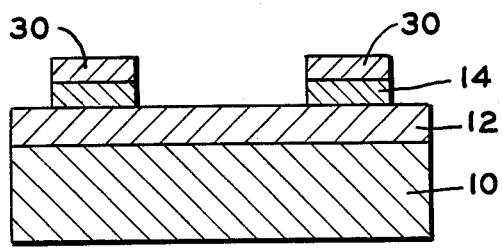

As illustrated in FIG. 2A, a first thin layer 12 of $Hg_{1-x}Cd_xTe$ with x approximately equal to 0.20 was grown on a substrate of CdTe 10 utilizing liquid phase epitaxy techniques. Methods of growing such crystals by liquid phase epitaxy are well established in the art and one such technique is illustrated and described in U.S. Pat. No. 3,902,924 issued Sept. 2, 1975 to Maciolek et al. This layer ultimately formed the photosensitive layer of the detector and was approximately $10^{-3}$ cm in thickness. Subsequently, a second thin layer 14 was grown on the first layer by similar techniques. The second layer reflected a small change in composition toward a higher bandgap alloy and was doped to the same concentration as the photosensitive layer. Thus, for a photosensitive layer 12 having a composition of $Hg_{0.80}Cd_{0.20}Te$ an overlayer 14 of composition $Hg_{0.78}Cd_{0.22}Te$ was used in one embodiment.

The photoconductor structure now included a top layer 14 of wider bandgap material approximately 5 microns in thickness. The surface was then solvent cleaned in a well-known manner and then pretreated with HMDS (hexamethyldisilizane) to promote surface adhesion followed by a photolithographic step (FIG. 2B) using the photoresist material SC100 (Hunt Chemical). The first photolithographic step protected areas 30 on the wafer for delineation of the contacts. The photoresist was then exposed and developed leaving the resist in the geometry of the particular areas designated for the blocking contacts.

The higher bandgap material forming the top layer other than in the contact areas was then etched away (FIG. 2C) utilizing a 1% bromine-methanol solution. The wafer was then dried in nitrogen gas and the photoresist stripped by plasma stripping.

Figure 2D:
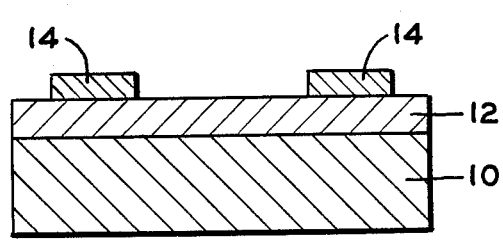

As seen in FIG. 2D, this left the blocking layer or higher bandgap energy layer 14 only in those areas directly delineated to be contact areas. The material 12 was exposed over the remainder of the surface.

Figure 2E:
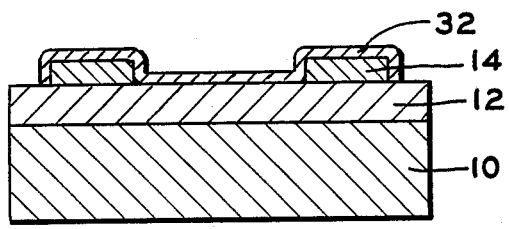
Figure 2F:
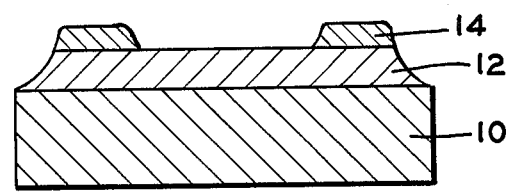
Figure 2G:
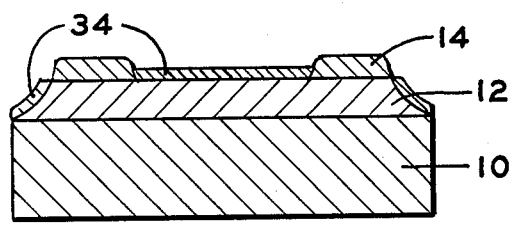

A second photolithographic step, illustrated in FIG. 2E, was utilized to delineate the desired photoconductive area of the device itself. After treatment with HMDS the wafer was coated at 32 with photoresist SC450 (Hunt Chemical) exposed and developed. The developed photoresist was then etched and dipped in a 1% Br-methanol rinse. The photoresist was stripped away by plasma stripping. This left the structure of FIG. 2F wherein the photosensitive layer 12 remained only in the area between the contacts.

The remainder of the fabrication was concerned with application of the actual contacts to the device and surface passivation of the photosensitive area of the device. In a third photoresist step, illustrated by FIG. 2G, photoresist AZ1375 was applied and allowed to dry in a dry box. The photoresist was exposed, developed and rinsed. Subsequent to this an additional layer of photoresist AZ1470 was applied, baked, exposed and developed.

Figure 2H:
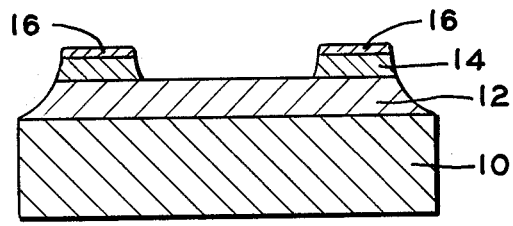
Figure 2I:
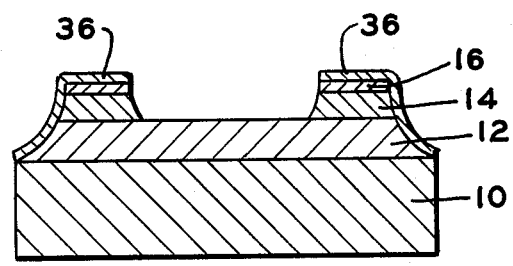
Figure 2J:
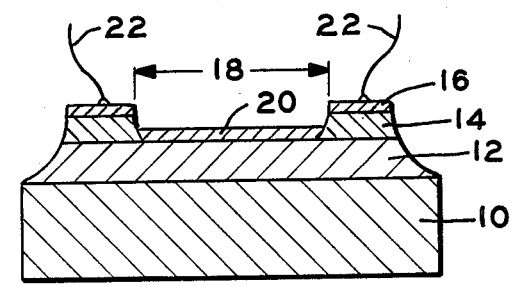

In the above manner, the entire photoconductive device was covered with a layer of photoresist shown at 34 except for the contact areas which were opened up for deposition of metal for ohmic contacts. Approximately 3300 Å of indium were evaporated onto the surface, followed by soaking in acetone to accomplish metal lift-off. This left a layer of indium at the points of desired ohmic contact, as illustrated by FIG. 2H.

This was followed by a final photoresist step (FIG. 2I) utilizing AZ1375 which was applied and developed to open up the photoactive area 18 for deposition of ZnS for surface passivation of the photoactive area. Approximately 1500 Å of ZnS at 20 (FIG. 2J) utilizing a well-known RF sputtering technique in which approximately 750 Å were deposited at 150 w and the other 750 Å at 250 w. Metal leads were then attached in conventional fashion, and the finished detector of FIG. 2J was produced.

It should be noted that the process example described herein calls for both ohmic contacts to be supplied with a higher bandgap layer 14 beneath the ohmic contact. As previously described and illustrated in FIG. 1, passivation occurs only for the contact attracting the minority carriers, in this case the holes of the hole-electron pairs and therefore passivation is not necessary under both of the contacts. Because the input of majority carriers is not impeded by the layer 14, however, placing the layers under both contacts appears to be preferred, as the facilitates fabrication and use of the device. Of course, other variations are contemplated in the process in accordance with the practices of those skilled in the art.

Other well-known processes may be used to produce the electromagnetic radiation-sensitive semiconductor devices of the present invention. In addition to the liquid phase epitaxial growth process described, the semiconductor layers and regions may conveniently be grown by vapor phase epitaxy techniques. It is further contemplated that other processes including vacuum deposition and ion implantation may be utilized.

In addition to the $Hg_{1-x}Cd_xTe$ semiconductor materials described in regard to the preferred embodiment, other well-known materials including $InAs_xSb_{1-x}$, $In_xGa_{1-x}Sb$ and $Pb_{1-x}Sn_xTe$ may be employed. Such alternative processes and compound usages are well known to those skilled in the art.

Figure 3:
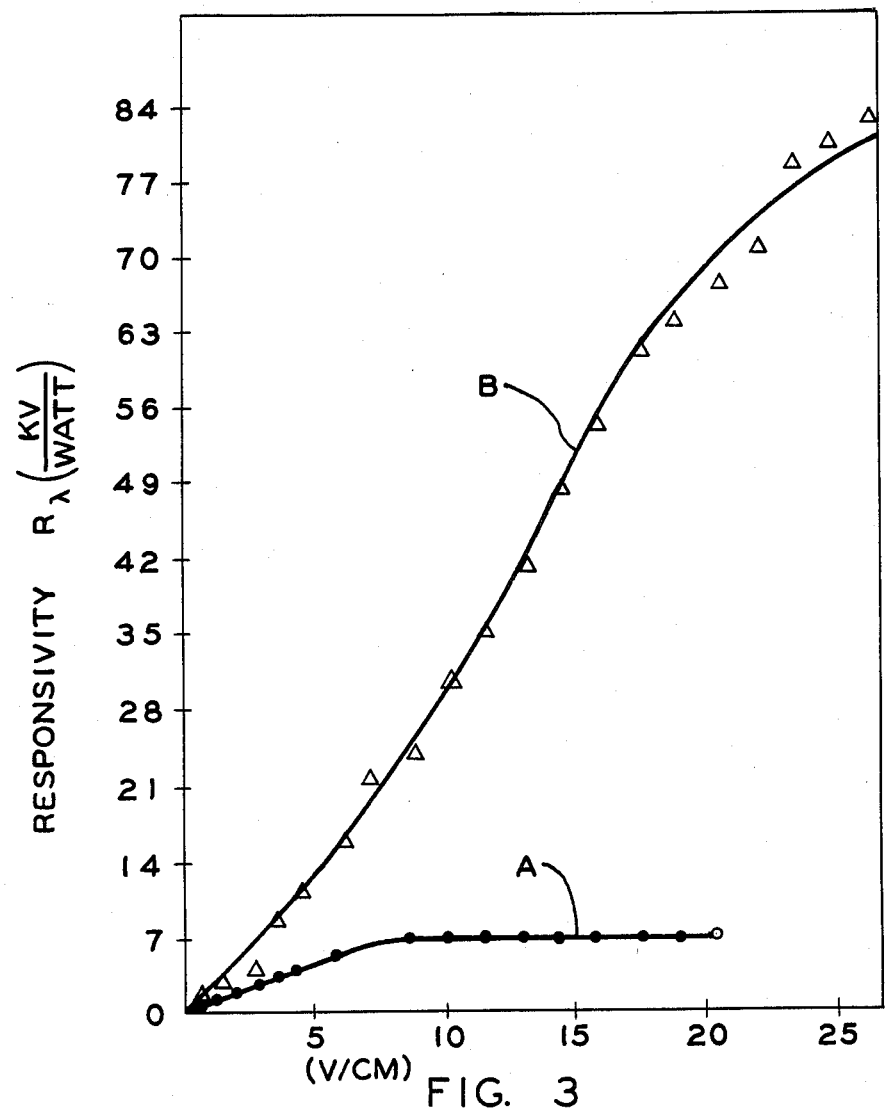
FIG. 3 is a graph illustrating the improvement responsivity of a $Hg_{1-x}Cd_xTe$ detector similar to that illustrated in FIG. 1 fabricated in accordance with the present invention.

The responsivity $R_\lambda$ of a detector having the composition profile illustrated in FIG. 1 and which was processed in accordance with the above process is shown in FIG. 3. Curve A was produced with the contact having the second or higher bandgap layer positively biased such that the minority carriers were not impeded as is the case with conventional detectors. Curve B was produced by reversing the leads so that minority carriers were impeded in accordance with the present invention. The conditions under which the measurements were made are given below:

$T_{blackbody}$—1000 Kelvin
Frequency—2 K Hertz

Detector resistance—71 Ohms
Detector temperature—90K
$H_{RMS}$—$1.5 \times 10^{-4}$ watts/cm$^2$
Detector area—$3.18 \times 10^{-5}$ cm$^2$
Photoconductive layer—x=0.20
Blocking layer—y=0.22

An enormous increase in $R_\lambda$ is observed when the contact that is negatively biased includes the second higher bandgap layer (i.e., when it is blocking) compared to when the contact that is negatively biased does not include the second higher bandgap layer (i.e., when it is ohmic). The saturation of $R_\lambda$ occurs at about 7 kV/W for the lower curve (A) at the low bias fields. This indicates that sweepout has occurred at low fields for a detector with conventional ohmic contacts. On the other hand, as seen in curve B, $R_\lambda$ is greater than 70 kV/W and still increasing.

These results are most significant since the demonstrate the enhancement possible using the multilayer photoconductor detector structure fabricated in accordance with the present invention. Using a bias field of approximately 20 V/cm, the responsivity is seen to increase by a full factor of 10.

It is thus seen that, in accordance with the present invention, an infrared detector may be processed so as to reduce the rate of recombination of the minority current carriers at the electrical contacts, without either impeding the flow of majority current carriers or significantly increasing the average carrier concentration of the semiconductor material since the barrier to minority carriers does not require increased majority carrier concentration. In turn, this increases the lifetime of the minority carriers, which then increases the detector responsivity.

It is appreciated that various modifications of the invention may occur to those skilled in the art. The foregoing description is accordingly not intended to be limiting of the invention.

The embodiments of the invention in which an exclusive property or right is claimed is defined as follows:

1. A photoconductive semiconductor device comprising:
   a substrate;
   a first layer of electromagnetic radiation sensitive semiconductor material of a given conductivity type and having a first energy bandgap on said substrate;
   a first region of a second layer of semiconductor material of the same conductivity type as said first layer of semiconductor material, but having a second energy bandgap greater than said first bandgap, and in electrical contact with said first layer; and
   a first ohmic contact means on and in electrical communication with said region of said second layer of semiconductor material and adapted to be connected to a first conductor of an external source of electrical voltage in a manner such that said ohmic contact will attract minority carriers;
   a second ohmic contact means on and in electrical communication with either said first or said second layer of semiconductor material and adapted to be connected to a second conductor of said external source of electrical voltage of opposite polarity to said first contact of said external source of electrical voltage; and
   wherein said first and second ohmic contact means on said semiconductor material are spaced from each other a sufficient distance such that external electromagnetic radiation may be sensed in the space therebetween.

2. A photoconductive semiconductor device comprising:
   a substrate;
   a first layer of electromagnetic radiation-sensitive semiconductor material of a given conductivity type and comprising a plurality of elemental species of a first percentage composition which produces a first energy bandgap;
   a first region of a second layer of electromagnetic radiation sensitive semiconductor material of the same conductivity type and comprising the same plurality of elemental species as said first layer of semiconductor material on said first layer of semiconductor material, but having a second percentage composition which produces a second energy bandgap greater than said first energy bandgap;
   a first ohmic contact means on and in electrical communication with said region of said second layer of semiconductor material and adapted to be connected to a first conductor of an external source of electrical voltage in a manner such that said first ohmic contact will attract minority carriers; and
   a second ohmic contact means on and in electrical communication with either said first or said second layer of semiconductor material and adapted to be connected to a second conductor of said external source of electrical voltage of opposite polarity to said first contact of said external source of electrical voltage; and
   wherein said first and second ohmic contact means on said semiconductor material are spaced from each other a sufficient distance such that external electromagnetic radiation may be sensed in the space therebetween.

3. The semiconductor device according to claim 1 wherein both of said ohmic contact means are on and in electrical communication with said second layer of semiconductor material.

4. The semiconductor device according to claim 2 wherein both of said ohmic contact means are on and in electrical communiction with said second layer of semiconductor material.

5. The semiconductor device according to any of claims 1, 2, 3 or 4 wherein said first layer of semiconductor material comprises $Hg_{1-x}Cd_xTe$ and where x is a number having a value between 0.1 and 0.4.

6. The semiconductor device according to claim 5 wherein said first layer of semiconductor material is $Hg_{1-x}Cd_xTe$ and wherein x is a number between 0.1 and 0.4; and wherein said second layer of semiconductor material comprises $Hg_{1-y}Cd_yTe$ wherein y is a number greater than x but less than unity.

7. The semiconductor device according to claim 6 wherein y exceeds x by at least 0.01.

8. The semiconductor device according to any of claims 1, 2, 3 or 4 wherein said first layer of semiconductor material is produced on said substrate by epitaxial formation.

9. The semiconductor device according to any of claims 1, 2, 3 or 4 wherein both said layers of semiconductor material are produced by liquid phase epitaxy.

10. The semiconductor device according to either of claims 3 or 4 wherein said second layer of semicondcutor material is coextensive with said first layer.

11. The semiconductor device according to either of claims 3 or 4 further comprising a second region of said second layer of semiconductor material substantially identical to said first region of said second layer of semiconductor material on said first layer of semiconductor material; and wherein said second ohmic contact is connected on said second region of said second layer of semiconductor material.

12. The semiconductor device according to any of claims 1, 2, 3 or 4 wherein said semiconductor material in both said layers is n-type.

13. A semiconductor device according to either of claims 1 or 2 wherein said first layer of said electromagnetic radiation-sensitive semiconductor material is one selected from the group consisting of $InAs_xSb_{1-x}$, $In_xGa_{1-x}Sb$, and $Pb_{1-s}Sn_xTe$ wherein x has a value greater than zero but less than unity.

14. A photoconductive semiconductor device comprising:
   a substrate;
   a first layer of $Hg_{1-x}Cd_xTe$ of a given conductivity type on said substrate, wherein x is a number having a value between 0.1 and 0.4;
   a first region of a second layer of $Hg_{1-y}Cd_yTe$ having the same conductivity type as said first layer of $Hg_{1-x}Cd_xTe$ material, wherein y is a number having a value greater than x but less than unity, on said first layer of semiconductor material; and
   a first ohmic contact means on and in electrical communication with said region of said second layer of semiconductor material and adapted to be connected to a first conductor of an external source of electrical voltage in a manner such that said first ohmic contact with attract minority carriers; and
   a second ohmic contact means on and in electrical communication with either said first or said second layer of semiconductor material and adapted to be connected to a second conductor of said external source of electrical voltage of opposite polarity of said first contact of said external source of electrical voltage; and
   wherein said first and second ohmic contact means on said semiconductor material are spaced from each other a sufficient distance such that external electromagnetic radiation may be sensed in the space therebetween.

15. A semiconductor device according to claim 14 wherein said conductivity is n-type.

16. The semiconductor device according to claim 14 wherein both of said ohmic contact means are on and in electrical contact with said second layer of semiconductor material.

17. The semiconductor device according to claim 14 wherein said second layer of semiconductor material is coextensive with said first layer and wherein both of said ohmic contact means are on and in electrical contact with said second layer of semiconductor material.

18. The semiconductor device according to claim 14 further comprising a second region of said second layer of semiconductor material substantially identical to said first region of semiconductor material on said first layer of semiconductor material; and wherein said second ohmic contact is on and in electrical communication with to said second region of said second layer of semiconductor material.

19. A semiconductor device according to any of claims 14 through 18 wherein said layer in said regions of $Hg_{1-x}Cd_xTe$ and $Hg_{1-y}Cd_yTe$ are formed by epitaxial growth.

20. A semiconductor device according to claim 19 wherein said epitaxial growth is liquid phase epitaxy.

21. The semiconductor device according to claim 19 wherein said epitaxial growth is vapor phase epitaxy.

22. A semiconductor device according to any of claims 14 through 18 wherein said layer of $Hg_{1-x}Cd_xTe$ has a thickness from about $5 \times 10^{-4}$ cm to about $15 \times 10^{-4}$ cm and said layer of $Hg_{1-y}Cd_yTe$ has a thickness from about $10^{-4}$ cm to $10^{-3}$ cm.

* * * * *